United States Patent
Turner et al.

(10) Patent No.: US 7,064,087 B1
(45) Date of Patent: Jun. 20, 2006

(54) PHOSPHOROUS-DOPED SILICON DIOXIDE PROCESS TO CUSTOMIZE CONTACT ETCH PROFILES

(75) Inventors: Michael Turner, Austin, TX (US); Waikit Fung, Mountain View, CA (US); Oliver Graudejus, Sunnyvale, CA (US); Doug Winandy, Austin, TX (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/998,993

(22) Filed: Nov. 15, 2001

(51) Int. Cl.
 *H01L 21/31* (2006.01)
(52) U.S. Cl. .................. 438/787; 438/783; 438/784; 438/5
(58) Field of Classification Search ............ 438/673, 438/713, 723, 725, 780, 781, 789, 790, 924, 438/784, 925, 783, 763, 618–651, 672, 909, 438/935, 787, 788, 919, 778, 14, 5; 216/62
See application file for complete search history.

(56) References Cited

U.S. PATENT DOCUMENTS

| | | | |
|---|---|---|---|
| 4,698,128 A | 10/1987 | Berglund et al. | 156/643 |
| 5,770,469 A | 6/1998 | Uram et al. | 437/240 |
| 6,051,870 A | 4/2000 | Ngo | 257/519 |
| 6,054,206 A | 4/2000 | Mountsier | 428/312.8 |
| 6,100,202 A * | 8/2000 | Lin et al. | 438/734 |
| 6,165,694 A | 12/2000 | Liu | 430/313 |
| 6,218,284 B1 | 4/2001 | Liu et al. | 438/624 |
| 6,426,015 B1 * | 7/2002 | Xia et al. | 216/62 |
| 6,506,690 B1 * | 1/2003 | Lobbins | 438/783 |
| 6,596,641 B1 * | 7/2003 | Jost et al. | 438/704 |
| 6,852,649 B1 * | 2/2005 | Phatak et al. | 438/783 |

\* cited by examiner

*Primary Examiner*—George Fourson
*Assistant Examiner*—Julio J. Maldonado
(74) *Attorney, Agent, or Firm*—Beyer Weaver & Thomas LLP.

(57) ABSTRACT

A method for depositing a doped silicon dioxide layer is provided that allows the dopant concentration in the silicon dioxide layer to be controlled throughout the layer. By controlling the dopant concentration throughout the layer the etch profile of contact holes etched into the layer can be controlled and footing can be prevented or eliminated. During the deposition of the silicon dioxide, the amount of dopant is increased as the temperature of the wafer is increased and held constant while the temperature of the wafer is constant.

23 Claims, 4 Drawing Sheets

PHOSPHOROUS-DOPED SILICON DIOXIDE PROCESS TO CUSTOMIZE CONTACT ETCH PROFILES

BACKGROUND OF THE INVENTION

1. Field of the Invention

The present invention relates generally to processes for depositing doped silicon dioxide in the manufacture of integrated circuit devices. In particular, a method for depositing doped silicon dioxide is provided that improves the etch profile of contact holes etched into the silicon dioxide layer.

2. Description of Related Art

In semiconductor devices, doped silicon dioxide is used to form insulating layers that electrically separate conduction layers from other conduction layers or transistor layers. The conduction layers are electrically connected through the insulating layer by metal filled holes, known as contacts or vias.

When forming the insulating layer, doped silicon dioxide is typically deposited using high density plasma chemical vapor deposition (HDPCVD). Contact holes are etched into the doped silicon dioxide layer with an etchant such as $C_4F_8$. A conductive metal such as tungsten is then deposited in the contact holes by chemical vapor deposition or other deposition technique.

The contact holes through the insulating layer must exhibit certain characteristics so that the metal deposited into the contact holes forms a good electrical connection. In particular, the etch profile of the contact holes must be controlled so that the deposited metal fills the holes and makes good contact to the underlying layer.

FIG. 1A is a cross-section of a device layer 105 that exhibits an undesirable etch profile known as "footing." Footing occurs when the doped silicon dioxide that is in the lower portion 107 of layer 105 is etched at a faster rate than the doped silicon dioxide that is in the upper portion 109 of layer 105.

Footing can cause, among other problems, poor contact between the metal used to fill the contact hole and the conductive layer beneath. For example, as illustrated by contact hole 201 of FIG. 1A, the faster etch rate of the lower portion 107 of doped silicon dioxide layer 105 may create a contact hole 210 with a narrow neck 204. When, as illustrated in FIG. 1B, a metal 212 is put into contact hole 201, the metal 212 may not completely fill hole 201, leaving the regions 214 unfilled. Metal 212 may not make contact, or may make only very poor contact, to the conduction layer 215.

Contact hole 220 of FIG. 2 illustrates another potential etch profile problem that may result in poor contact to the conduction layer 215. The etch of hole 220 progressed horizontally instead of vertically, resulting in an incomplete etch of layer 105. The remaining material 222 of layer 105 prevents a metal from contacting the conductive layer 215 through the hole 220.

The problem of footing is becoming more significant as integrated circuit devices are made smaller and device features are more densely packed. In addition to the above described problems of poor contact, footing widens the contact hole and makes the exact dimensions of the contact hole difficult to control. As device dimensions shrink, the dimension tolerances also shrink, and thus the ability to control the etch profile of contact holes in doped silicon dioxide becomes more important.

SUMMARY

A method for depositing a doped silicon dioxide layer is provided that limits footing in contact holes etched into the layer so deposited. The method allows the dopant concentration in the silicon dioxide layer to be controlled throughout the layer so that the etch profile of contact holes subsequently etched into the layer can be controlled.

Dopant precursor gas and silicon-containing precursor gas are introduced into a plasma at an initial ratio of dopant precursor gas to silicon-containing gas. During an initial period of the deposition, while the temperature of the wafer is increasing, the initial ratio is changed to a final ratio, usually by increasing the ratio. During the final period of the deposition, while the wafer is at an essentially constant temperature, the ratio is held constant. The concentration of dopant incorporated into the layer during the initial period is thus about the same as the concentration of dopant incorporated into the layer during the final period.

DETAILED DESCRIPTION

Figure 1A:
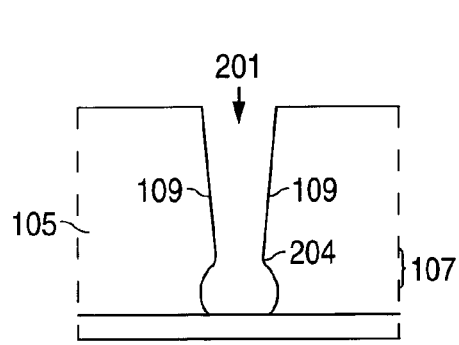
FIG. 1A (prior art) is a cross-sectional view of a contact hole in an insulating layer that has a footing etch profile with a narrow neck.
Figure 1B:
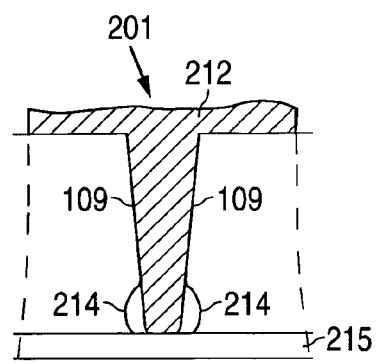
FIG. 1B (prior art) illustrates the contact hole of FIG. 1A filled with a metal.
Figure 2:
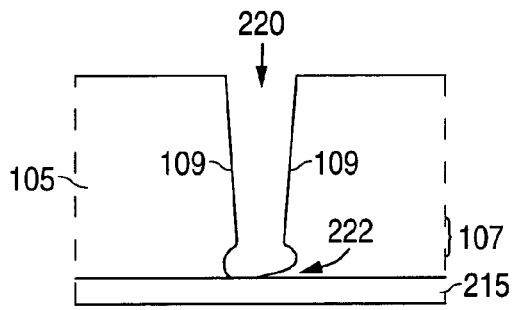
FIG. 2 (prior art) is a cross-sectional view of a contact hole in an insulating layer with a contact hole that has not been etched all the way through the insulating layer due to footing.

It has been observed that the etch rate of a doped silicon dioxide layer is sensitive to the concentration of dopant in the layer, and that footing may be the result of non-uniform dopant concentration through the layer. The etch rate of phosphorous-doped silicon dioxide is faster in regions that have a higher concentration of dopant. Using conventional deposition methods, the lower portion of a doped silicon dioxide layer which is close to the substrate surface, e.g., portion 107 of FIG. 1A, typically has a higher dopant concentration than the upper portion of the layer (portion 109 of FIG. 1A, which is often referred to as the bulk layer). Thus, lower portion 107 is etched faster, resulting in the footing problem described above in the text accompanying FIGS. 1A, 1B, and 2.

Figure 3:
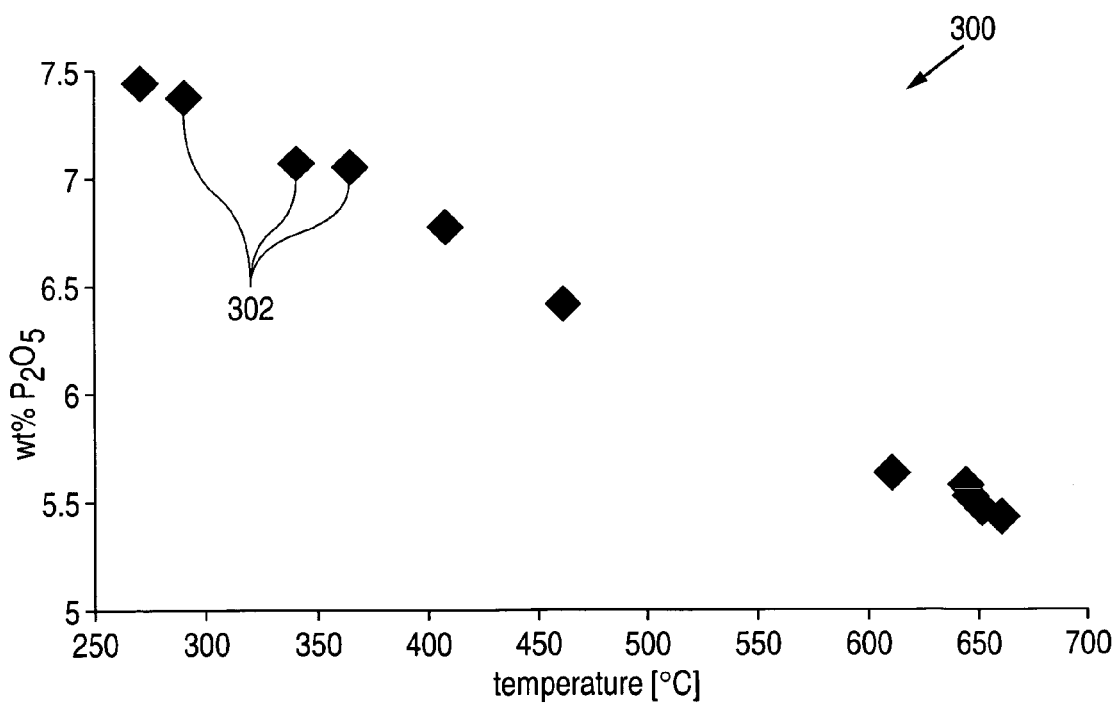
FIG. 3 is a graph of the percentage of phosphorous dopant incorporated into silicon dioxide as a function of wafer temperature during deposition of the doped silicon dioxide.

The cause of the variation in dopant concentration is related to the temperature of the wafer during the deposition process. FIG. 3 is a graph 300 illustrating the concentration of phosphorous dopant in silicon dioxide (wt % $P_2O_5$) as a function of wafer temperature. Each point 302 in graph 300 corresponds to the phosphorous concentration in a silicon dioxide layer that was deposited at a particular temperature. The ratio of the flow rate of phosphine gas to the flow rate of silane gas was 1:2 (33% phosphine) for each deposition. It is clear from FIG. 3 that at higher wafer temperatures the concentration of phosphorous dopant incorporated into silicon dioxide is reduced.

Figure 4:
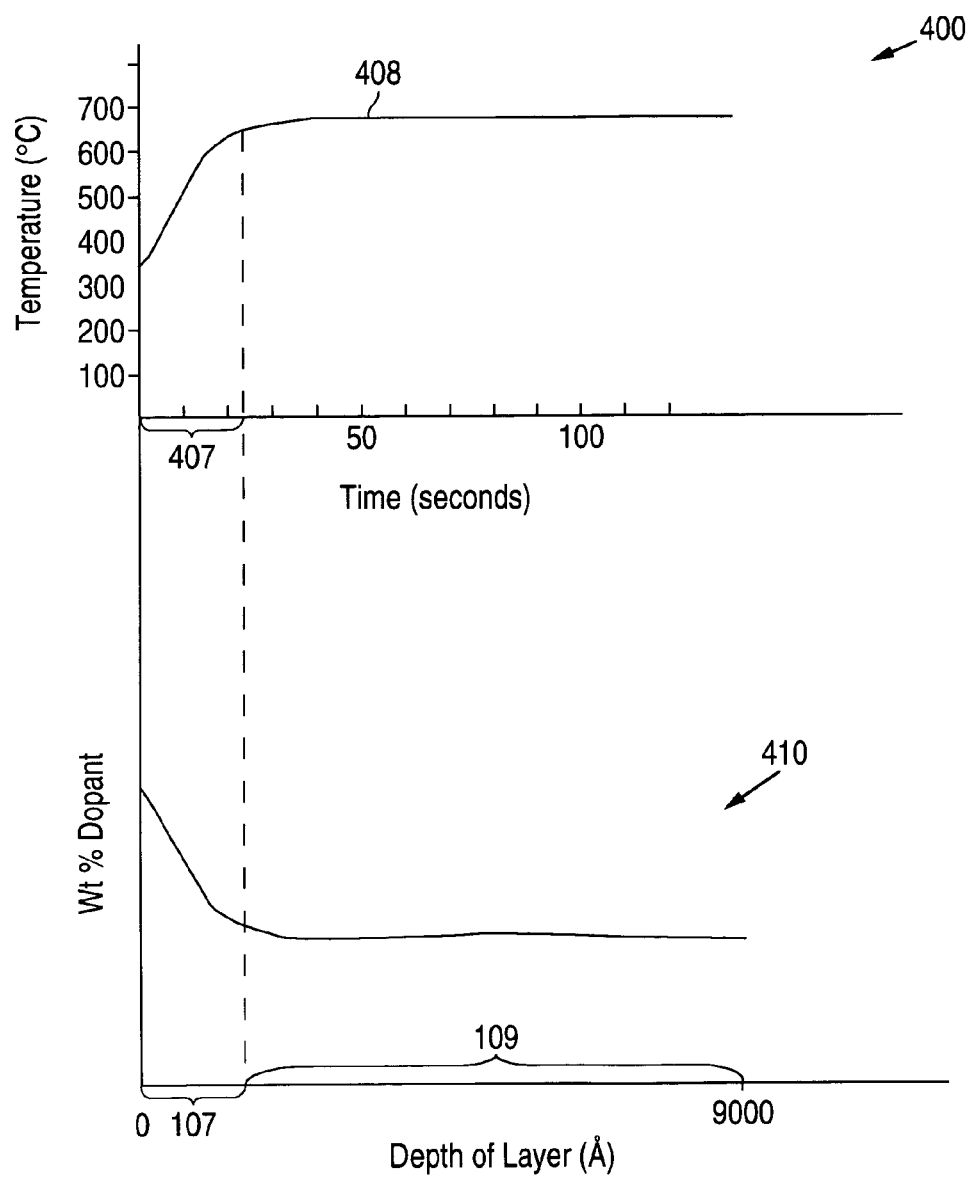
FIG. 4 is a graph of the change in wafer temperature during a typical doped silicon dioxide deposition and the corresponding graph of the amount of dopant incorporated into the layer.

In conventional deposition processes, the wafer temperature is not constant throughout the deposition. Graph 400 of FIG. 4 illustrates a change in wafer temperature during an exemplary deposition of a doped silicon dioxide layer. The wafer is typically preheated to, for example, 350° C. before beginning the deposition. During an initial period 407 of the deposition, the wafer temperature increases until it reaches a final deposition temperature 408, which in this case is about 650° C.

As illustrated by graph 410 of FIG. 4, which shows the dopant concentration as a function of depth of the deposited silicon dioxide layer, the change in wafer temperature shown in graph 400 affects the amount of dopant that is incorporated into the layer during deposition. The dopant concentration is higher in the lower portion 107 of the wafer, which is the portion deposited during the initial period 407 of the deposition, while the wafer is at a lower temperature. The dopant concentration levels off in the upper portion or bulk 109 of the layer, which is deposited while the wafer is at the relatively constant final temperature 408. Thus, the temperature changes during the deposition cause the amount of dopant that is incorporated into the silicon dioxide to be non-uniform throughout the layer.

Figure 5:
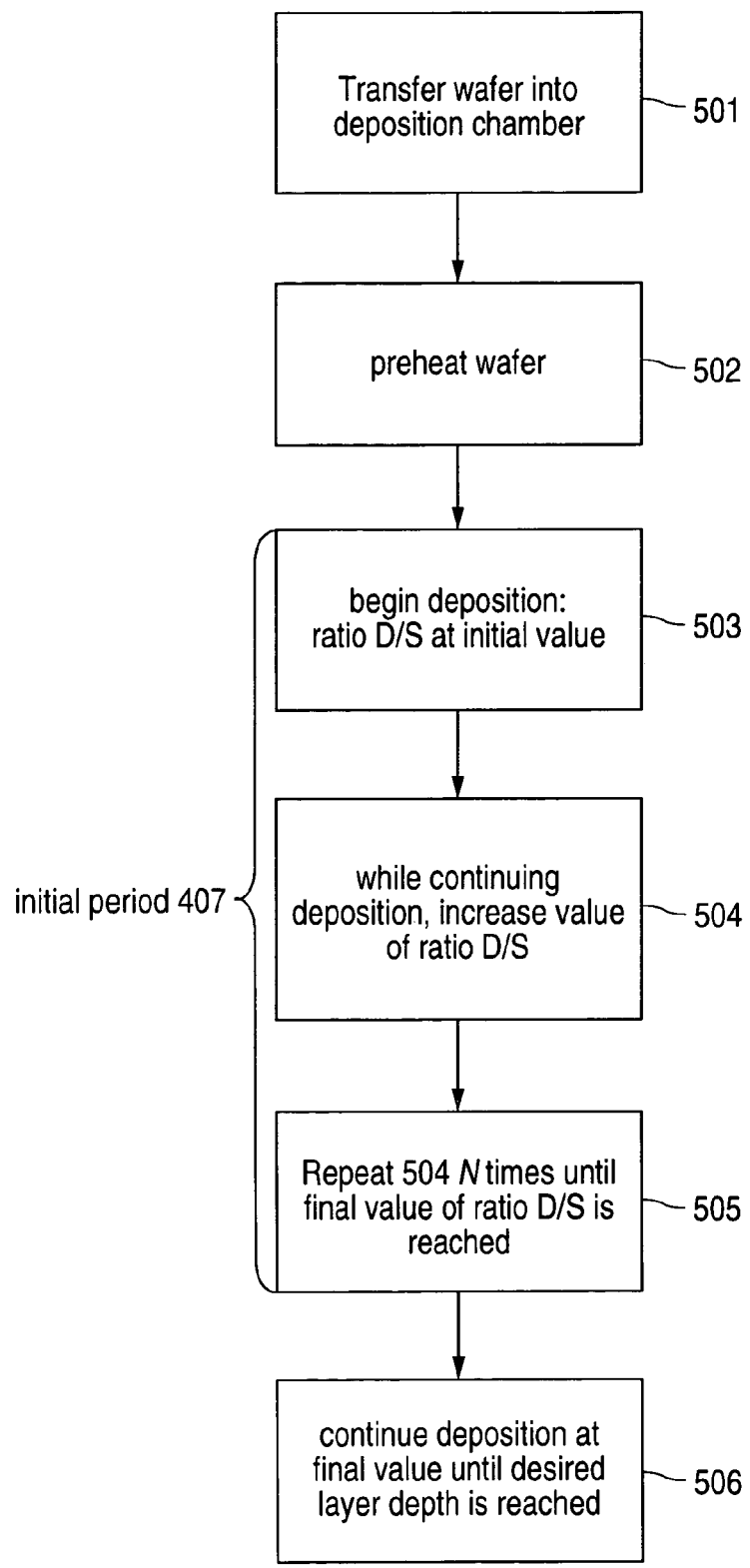
FIG. 5 is a block diagram illustrating a method of depositing a doped silicon dioxide layer so that contact holes etched into the layer have straight sidewalls and do not exhibit footing.

To prevent footing, the silicon dioxide layer should have an essentially uniform dopant concentration throughout. A method for depositing a doped silicon dioxide layer with a more uniform dopant concentration throughout the layer is illustrated in FIG. 5. In this method, the amount of dopant precursor gas supplied during the initial period 407 of the deposition is modulated to compensate for the higher amount of dopant that is incorporated into the silicon dioxide layer while the wafer temperature is below the final deposition temperature 408.

As indicated in block 501 of FIG. 5, the wafer is first transferred into the deposition chamber, typically an HDPCVD chamber, for example, the Speed™ reactor of Novellus Systems, Inc. (San Jose, Calif.). As indicated in block 502, the wafer is preheated, usually between 0 and 60 seconds, before the deposition is begun. The preheat is usually performed under idle plasma conditions, e.g., with $He/O_2$ or $Ar/O_2$ gases at the appropriate RF power, e.g., 3000 to 5000 W of low frequency power for 200 mm wafers. The preheat conditions may change for different size wafers.

The deposition is started, block 503, by introduction of precursor gases into the reaction chamber. The precursor gases include a silicon-containing precursor gas, for example silane or TEOS and a dopant precursor gas, for example phosphine ($PH_3$) or $SiF_4$. As indicated in block 503, the amount of dopant precursor gas introduced into the chamber at the beginning of the deposition, given as a ratio of the flow rate of the dopant precursor gas to the flow rate of the silicon-containing precursor gas (hereinafter "dopant/silicon ratio") is at an initial value. The initial value of the dopant/silicon ratio is typically lower than the final value (block 506) as described below.

As illustrated above in FIG. 4, as the temperature of the wafer increases during the initial period 407 of the deposition, the amount of dopant incorporated into the silicon dioxide layer is reduced. To compensate for this reduction, the amount of dopant precursor gas introduced into the reaction chamber is increased during initial period 407. As shown in blocks 504 and 505, the amount of dopant precursor gas introduced into the chamber is increased in a series of N increments until the dopant/silicon ratio reaches the final value. The final value is the ratio that provides the desired dopant concentration in the bulk layer 109 at the final temperature. As shown in block 506, once the final value of the dopant/silicon ratio is reached, the deposition continues until the desired layer thickness is reached.

The amount of dopant precursor gas introduced into the chamber, both initially (block 503) and in each of the N increments (blocks 504/505), is adjusted so that the amount of dopant incorporated into the lower portion 107 of the silicon dioxide layer is the same as that incorporated into the bulk layer 109. The dopant/silicon ratio can be increased to its final value in a series of discrete increases, or by constantly increasing the dopant/silicon ratio until the final value is reached. Either method provides a relatively uniform dopant concentration throughout the layer. As discussed above, the etch profile is very sensitive to the dopant concentration. The number of increments used to increase the dopant/silicon ratio should be sufficient so that the dopant concentration is sufficiently uniform to ensure the desired etch profile, e.g., an etch profile with straight sidewalls.

Figure 6:
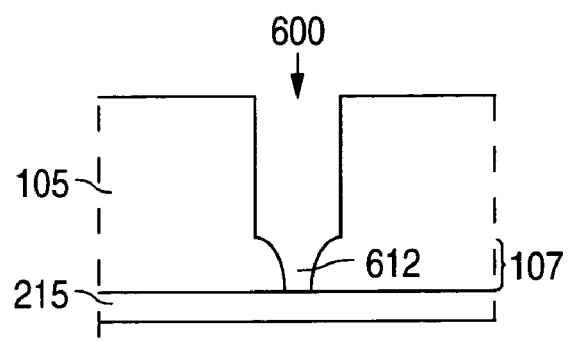
FIG. 6 is a cross-sectional view of a contact hole having an etch profile that is too narrow in the lower portion.

It is also important not to overcompensate for the increased incorporation of dopant during initial period 407 by using too low a ratio of dopant precursor gas to silicon precursor gas during initial period 407. FIG. 6 illustrates a contact hole 600 having an etch profile that is obtained if too little dopant is incorporated into the silicon dioxide in lower portion 107. The etch profile will be too narrow at the bottom 612 of the contact hole 600, which may hinder good contact between a metal fill and the conduction layer 215.

Figure 7:
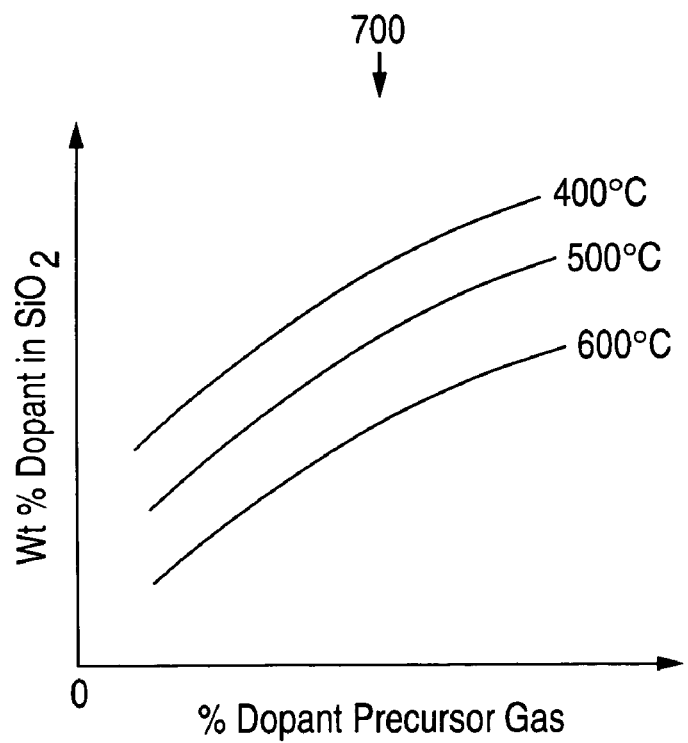
FIG. 7 is a graph illustrating of the amount of dopant incorporated into a silicon dioxide layer as a function of the amount of dopant precursor gas supplied during the deposition at three different temperatures.

The ratio of dopant precursor gas to silicon precursor gas to use during period 407 for a particular set of process conditions, dopant, and desired dopant concentration may be determined by trial and error, by performing a number of test depositions and etches until the desired etch profile is obtained. Alternatively, dopant profiles, such as those illustrated in graph 700 of FIG. 7, can be measured for a series of test depositions at different temperatures and used to estimate the percentage of dopant precursor gas that will provide the desired dopant concentration. In the dopant profiles in graph 700, the wafer is held at a particular temperature, e.g., 400° C., 500° C., and 600° C., and the amount of dopant precursor gas is varied for each test deposition. The conditions of the test depositions, including $He/O_2$ or $Ar/O_2$ flow rate, RF powers, and chamber pressure are otherwise the same as will be used for the deposition to be performed by the method outlined in FIG. 5. The concentration of dopant incorporated into a silicon dioxide layer at each ratio of dopant precursor gas is measured. In this way, the amount of dopant precursor gas that results in the desired concentration of dopant in the layer is determined for the particular temperature and set of process conditions being used.

The dopant profile information can be used with temperature profile information, such as that illustrated in graph 400 of FIG. 4 and measured in a separate test deposition, to estimate the amount of dopant precursor gas to use initially and for each increment of initial period 407. The number N of increments and the length of each increment to use during initial period 407 of a deposition can also be estimated from the wafer temperature information. For example, for very large temperature differences between the initial and final deposition phases, more increments can be used. Longer increments or continuous dopant/silicon ratio adjustment can be used when the temperature change occurs more gradually.

After the deposition, the wafer is removed from the deposition chamber. To form the contact or via holes, the layer is typically planarized and a patterned mask is formed on the surface for the subsequent etch step, both by methods understood by those of skill in the art. The contact or via holes are then etched, typically by a dry etch method using $C_4F_8$, or by other methods also known to those of skill in the art. The resulting contact holes have straight sidewalls and do not exhibit footing.

The method illustrated in FIG. 5 may be used for any dopant to improve the etch profile and reduce footing effects, for example, phosphorous by using $PH_3$ as the dopant precursor, fluorine by using $SiF_4$ as the dopant precursor, boron by using $B_2H_6$ as the dopant precursor, or boron in conjunction with phosphorous.

EXAMPLE

In an exemplary embodiment, contact holes etched into a phosphorous-doped silicon dioxide (PSG) layer formed by the method of FIG. 5 have a good etch profile with straight sidewalls and without footing. In this example, two mass flow controllers control the $SiH_4$ flowrate, the $PH_3$ flowrate, and the dopant/silicon ratio. One mass flow controller is connected to a 100% $SiH_4$ source and the other mass flow controller is connected to a 50% $SiH_4$/50% $PH_3$ source. Specific conditions used to form the PSG layer are listed in Table 1, below.

TABLE 1

| PREHEAT | |
| --- | --- |
| LF power at 450 kHz | 4000 W |
| $O_2$ flow rate | 120 sccm |
| He flow rate | 200 sccm |
| Time | 30 seconds |
| Wafer temperature | to 350° C. |
| DEPOSITION | |
| LF power at 450 kHz | 4000 W |
| HF power at 13.56 MHz | 2000 W |
| $O_2$ flow rate | 500 sccm |
| He flow rate | 100 sccm |
| $SiH_4$ flow rate | 127.5 sccm for 2 seconds |
| | 122.5 sccm for 2 seconds |
| | 117.5 sccm for 2 seconds |
| | 112.5 sccm for 2 seconds |
| | 107.5 sccm for 106 seconds |
| $PH_3$ flow rate: | 62.5 sccm for 2 seconds |
| | 67.5 sccm for 2 seconds |
| | 72.5 sccm for 2 seconds |
| | 77.5 sccm for 2 seconds |
| | 82.5 sccm for 106 seconds |

The total time for the deposition was 114 seconds, which produces a layer that is about 9000 Å thick. An HDPCVD reactor, the Speed™ reactor by Novellus Systems, San Jose, Calif., was used for the deposition and the chamber pressure was maintained at a pressure of less than 10 mtorr. The final phosphine flow rate, 82.5 sccm (a ratio of phosphine to silane of 0.767:1), provided a dopant ($P_2O_5$) concentration in the top portion (bulk) of the layer of 9% by weight under constant temperature condition, i.e., when the final temperature (approximately 650° C.) was reached. Each of the phosphine flow increments, 62.5, 67.5, 72.5, and 77.5 sccm, (providing ratios of 0.490, 0.551, 0.617, and 0.689, respectively) would provide 7.0%, 7.5%, 8.0%, and 8.5%, respectively, dopant concentration by weight in the top part (bulk) of the layer under constant temperature condition at the final temperature. However, because the temperature is low during the initial phase of the deposition, these lower flow rates provide closer to 9% dopant in the layer. Thus, a silicon dioxide layer having a relatively uniform dopant concentration of 9% by weight is produced.

During experimentation, when a flow rate that provides 6% dopant concentration in the bulk layer under steady state conditions was used for the initial percentage, the etch profile of the layer was narrower at the bottom, similar to the etch profile illustrated in FIG. 6.

The embodiments of this invention described above are illustrative and not limiting. Many additional embodiments will be apparent to persons skilled in the art from the descriptions herein. For example, different deposition processes may have different temperature profiles, e.g., the temperature of the wafer may decrease at the end of the deposition. Using the methods described herein, the variation of dopant concentration within a layer due to any such temperature variations may be compensated for by adjusting the dopant precursor gas flow rates, to provide the desired etch profile. Similarly, using the methods described herein, a non-uniform doped silicon dioxide layer may be purposely deposited if it is desired to create a contact hole having a profile with a particular shape. These and other embodiments are intended to fall within the scope of the appended claims.

We claim:

1. A method for depositing a doped silicon dioxide layer onto a wafer comprising:

introducing a dopant precursor gas having a dopant precursor gas flow rate and a silicon-containing gas having a silicon-containing gas flow rate into a plasma within a deposition chamber, wherein a ratio of the dopant precursor gas flow rate to the silicon-containing gas flow rate has an initial value;

increasing the ratio within the deposition chamber from the initial value to a final value during an initial deposition period; and maintaining the ratio within the deposition chamber at the final value during a final deposition period, wherein during the initial deposition period and the final deposition period the dopant precursor gas and the silicon-containing precursor gas react in the plasma to form the doped silicon dioxide layer on the wafer, and wherein the initial value of the ratio is determined by:

measuring a concentration of dopant incorporated into a portion of a silicon dioxide layer as a function of the ratio for a first series of test depositions performed at a constant temperature;

repeating the measurement of dopant concentration for a second series of test depositions performed at a different constant temperature; and measuring a temperature profile of the wafer during a third test deposition wherein the temperature is not held constant.

2. The method of claim 1, wherein a portion of the doped silicon dioxide layer deposited during the initial deposition period has about the same dopant concentration as a portion of the doped silicon dioxide layer deposited during the final period.

3. The method of claim 1, further comprising etching one or more contact holes through the doped silicon dioxide layer, wherein the one or more contact holes have straight sidewalls.

4. The method of claim 1, further comprising determining a duration of the initial deposition period by measuring a temperature of the wafer during a test deposition of a doped silicon dioxide layer, wherein the duration is the time required for the temperature to reach an essentially constant value.

5. The method of claim 1, wherein increasing the ratio from the initial value to the final value comprises:
   dividing the initial deposition period into a number of increments; and
   increasing the ratio by an intermediate value at each increment.

6. The method of claim 1, wherein the dopant precursor gas is phosphine and the silicon-containing precursor gas is silane.

7. The method of claim 1 further comprising preheating the wafer to a preheat temperature.

8. The method of claim 7, wherein the dopant precursor gas is phosphine and the silicon-containing precursor gas is silane, the preheat temperature is 350° C., the initial value of the ratio is about 0.49, and the final value of the ratio is about 0.77.

9. The method of claim 1 wherein the dopant precursor gas is selected from the group consisting of $PH_3$, $SiF_4$, and $B_2H_6$.

10. A method for depositing a doped silicon dioxide layer comprising:
   introducing a dopant precursor gas and a silicon-containing gas into a plasma at a dopant precursor gas flow rate and a silicon-containing gas flow rate for a deposition period; and
   during the deposition period, adjusting a ratio of the dopant precursor gas flow rate and the silicon-containing gas flow rate as a function of wafer temperature, whereby the dopant precursor gas and silicon-containing gas react in the plasma to form the doped silicon dioxide layer having a defined dopant concentration, wherein a set of values of the ratio to be used during the deposition are determined by
      measuring a concentration of dopant incorporated into a portion of a silicon dioxide layer as a function of the ratio for a first series of test depositions performed at a constant temperature;
   repeating the measurement of dopant concentration for a second series of test depositions performed at a different constant temperature; and
   measuring a temperature profile of the wafer during a third test deposition wherein the temperature is not held constant.

11. The method of claim 10, wherein the dopant concentration is essentially uniform throughout the layer.

12. The method of claim 10, further comprising etching one or more contact holes through the doped silicon dioxide layer, wherein said one or more contact holes have essentially straight sidewalls.

13. The method of claim 10, wherein:
   the temperature profile comprises an initial period during which the temperature of the wafer is increasing and a final period during which the temperature of the wafer is constant; and
   during the deposition the ratio is increased from an initial value to a final value during the initial period and the ratio is held at the final value during the final period.

14. The method of claim 13, wherein increasing the ratio from the initial value to the final value comprises:
   dividing the initial period into a number of increments; and
   increasing the ratio by an intermediate value at each increment.

15. The method of claim 10, wherein the dopant precursor gas is phosphine and the silicon-containing precursor gas is silane.

16. The method of claim 10 further comprising preheating the wafer to a preheat temperature.

17. The method of claim 16, wherein the dopant precursor gas is phosphine and the silicon-containing precursor gas is silane, the preheat temperature is 350° C., the initial value of the ratio is about 0.49, and the final value of the ratio is about 0.77.

18. The method of claim 10 wherein the dopant precursor gas is selected from the group consisting of $PH_3$, $SiF_4$, and $B_2H_6$.

19. A method for depositing a doped silicon dioxide layer onto a wafer, the method comprising:
   introducing a dopant precursor gas having a dopant precursor gas flow rate and a silicon-containing gas having a silicon-containing gas flow rate into a plasma, wherein a ratio of the dopant precursor gas flow rate to the silicon-containing gas flow rate has an initial value;
   increasing the ratio from the initial value to a final value during an initial period;
   determining a duration of the initial period by measuring a temperature of the wafer during a test deposition of a doped silicon dioxide layer, wherein the duration is the time required for the temperature to reach an essentially constant value; and
   maintaining the ratio at the final value during a final period,
   wherein during the initial period and the final period the dopant precursor gas and the silicon-containing precursor gas react in the plasma to form the doped silicon dioxide layer on the wafer, and wherein the initial value of the ratio is determined by:
   measuring a concentration of dopant incorporated into a portion of a silicon dioxide layer as a function of the ratio for a first series of test depositions performed at a constant temperature;
   repeating the measurement of dopant concentration for a second series of test depositions performed at a different constant temperature; and
   measuring a temperature profile of the wafer during a third test deposition wherein the temperature is not held constant.

20. A method for depositing a doped silicon dioxide layer onto a wafer, the method comprising:
   introducing a dopant precursor gas having a dopant precursor gas flow rate and a silicon-containing gas having a silicon-containing gas flow rate into a plasma, wherein a ratio of the dopant precursor gas flow rate to the silicon-containing gas flow rate has an initial value;
   increasing the ratio from the initial value to a final value during an initial period;
   maintaining the ratio at the final value during a final period, wherein during the initial period and the final period the dopant precursor gas and the silicon-containing precursor gas react in the plasma to form the doped silicon dioxide layer on the wafer; and measuring a concentration of dopant incorporated into a portion of a silicon dioxide layer as a function of the ratio for a first series of test depositions performed at a constant temperature;

repeating the measurement of dopant concentration for a second series of test depositions performed at a different constant temperature; and measuring a temperature profile of the wafer during a third test deposition wherein the temperature is not held constant, whereby the initial value of the ratio is determined.

21. A method for depositing a doped silicon dioxide layer, the method comprising:

introducing a dopant precursor gas and a silicon-containing gas into a plasma at a dopant precursor gas flow rate and a silicon-containing gas flow rate for a deposition period;

adjusting, during the deposition period, a ratio of the dopant precursor gas flow rate and the silicon-containing gas flow rate as a function of wafer temperature, whereby the dopant precursor gas and the silicon-containing gas react in the plasma to form the doped silicon dioxide layer having a defined dopant concentration;

measuring a concentration of dopant incorporated into a portion of a silicon dioxide layer as a function of the ratio for a first series of test depositions performed at a constant temperature;

repeating the measurement of dopant concentration for a second series of test deposition performed at a different constant temperature; and measuring a temperature profile of the wafer during a third test deposition wherein the temperature is not held constant, whereby a set of values of the ratio to be used during the deposition are determined.

22. The method of claim 21, wherein:

the temperature profile comprises an initial period during which the temperature of the wafer is increasing and a final period during which the temperature of the wafer is constant; and during the deposition the ratio is increased from an initial value to a final value during the initial period and the ratio is held at the final value during the final period.

23. The method of claim 22, wherein increasing the ratio from the initial value to the final value comprises:

dividing the initial period into a number of increments; and increasing the ratio by an intermediate value at each increment.

* * * * *